(12) United States Patent
Machir et al.

(10) Patent No.: US 7,930,944 B2
(45) Date of Patent: Apr. 26, 2011

(54) ASIC COMPENSATED PRESSURE SENSOR WITH SOLDERED SENSE DIE ATTACH

(75) Inventors: Jim Machir, Columbus, OH (US); Todd Eckhardt, Westerville, OH (US); Paul Rozgo, Dublin, OH (US); William S. Hoover, Plain City, OH (US)

(73) Assignee: Honeywell International Inc., Morristown, NJ (US)

( * ) Notice: Subject to any disclaimer, the term of this patent is extended or adjusted under 35 U.S.C. 154(b) by 181 days.

(21) Appl. No.: 12/120,378

(22) Filed: May 14, 2008

(65) Prior Publication Data

US 2009/0282925 A1 Nov. 19, 2009

(51) Int. Cl.
*G01L 7/00* (2006.01)
(52) U.S. Cl. ............................................. 73/756; 73/753
(58) Field of Classification Search ................... None
See application file for complete search history.

(56) References Cited

U.S. PATENT DOCUMENTS

| | | | | |
|---|---|---|---|---|
| 4,129,042 A | * | 12/1978 | Rosvold | 73/727 |
| 4,168,630 A | * | 9/1979 | Shirouzu et al. | 73/727 |
| 4,314,225 A | * | 2/1982 | Tominaga et al. | 338/4 |
| 4,656,454 A | * | 4/1987 | Rosenberger | 338/2 |
| 4,763,098 A | * | 8/1988 | Glenn et al. | 338/4 |
| 4,939,497 A | * | 7/1990 | Nishida et al. | 338/4 |
| 5,025,667 A | * | 6/1991 | Strasser | 73/724 |
| 5,257,457 A | | 11/1993 | Boyer | |
| 5,465,626 A | * | 11/1995 | Brown et al. | 73/715 |
| 5,811,690 A | | 9/1998 | Hershey | |
| 6,351,996 B1 | | 3/2002 | Nasiri et al. | |
| 6,868,731 B1 | | 3/2005 | Gatesman | |
| 6,931,938 B2 | | 8/2005 | Knirck et al. | 73/754 |
| 6,945,120 B1 | * | 9/2005 | Marcus et al. | 73/756 |
| 7,073,375 B2 | | 7/2006 | Parker et al. | 73/118.1 |
| 7,077,008 B2 | | 7/2006 | Pham et al. | 73/716 |
| 7,194,910 B2 | | 3/2007 | Gatesman | |
| 7,603,906 B2 | | 10/2009 | Kroger et al. | |
| 7,635,077 B2 | | 12/2009 | Schubert | |
| 7,647,835 B2 | | 1/2010 | Speldrich | |
| 7,677,109 B2 | | 3/2010 | Bentley et al. | |

(Continued)

FOREIGN PATENT DOCUMENTS

EP 1255099 11/2002

(Continued)

OTHER PUBLICATIONS

Pressure Sensors-Miniature Signal Conditioned 40PC Series, Sensing and Control, Honeywell International, 1999.

(Continued)

*Primary Examiner* — Harshad Patel
*Assistant Examiner* — Jermaine Jenkins

(57) ABSTRACT

An ASIC compensated pressure sensor includes a sense die, an ASIC chip, and supporting elements. The sense die includes a metallized surface for attaching the sense die to a mounting surface. The resulting solder joint provides a hermetic seal that is resistant to a wide range of media associated with different environmental conditions. The mounting surface can contain the ASIC and electronics for compensation or can be attached to another mounting surface, which contains the ASIC and electronics. Either configuration can include collars of different styles for ease of assembly and in turn can be attached to a mating connector. The mounting surface can possess a closely matched coefficient of thermal expansion to the sense die in order to enhance electrical stability of the output signal over a wide temperature and pressure ranges.

17 Claims, 4 Drawing Sheets

U.S. PATENT DOCUMENTS

| | | |
|---|---|---|
| 7,759,945 B2 | 7/2010 | Wade |
| 7,802,481 B2 | 9/2010 | Henn et al. |
| 2007/0271069 A1 | 11/2007 | Dmytriw et al. |
| 2008/0222884 A1 | 9/2008 | Bradley et al. |

FOREIGN PATENT DOCUMENTS

| | | |
|---|---|---|
| EP | 1677090 | 7/2006 |
| EP | 1764598 | 3/2007 |
| JP | 4155233 | 5/1992 |
| JP | 8075581 | 3/1996 |
| JP | 11337431 | 12/1999 |
| JP | 200004667 | 2/2000 |
| JP | 2000180282 | 6/2000 |
| JP | 2000180283 | 6/2000 |
| JP | 2000352540 | 12/2000 |
| JP | 2001208626 | 8/2001 |
| JP | 2003057138 | 2/2003 |
| WO | 20040013538 | 12/2003 |

OTHER PUBLICATIONS

Honeywell, "40PC Slides," 2 pages, prior to May 14, 2008.

* cited by examiner

ASIC COMPENSATED PRESSURE SENSOR WITH SOLDERED SENSE DIE ATTACH

TECHNICAL FIELD

Embodiments are generally related to sensor methods and systems. Embodiments are also related to pressure sensors that incorporate application specific integrated circuit components. Embodiments are additionally related to techniques for attaching pressure sensing components to a sensor housing.

BACKGROUND OF THE INVENTION

A pressure sensor is utilized to sense the pressure difference between a detecting pressure and an atmospheric pressure or fluid pressure, and then convert the detected pressure difference into an electric signal. Pressure sensors can be utilized to measure pressures of gases or liquids and are employed in a wide range of industrial, commercial and consumer applications. Pressure measurements typically are taken in the context of absolute, gauge, or differential (or relative) measurements. An absolute pressure sensor represents a specific type of sensing device, which measures a pressure relative to a vacuum. A gauge sensor, on the other hand, measures a pressure relative to atmospheric pressure. A differential pressure sensor measures a pressure difference between two inputs.

A typical sensor package housing is configured from premolded plastic and includes a metal lead frame for providing interconnection to external circuitry. Such a package further includes a lid having an opening for directing external pressure to the sensor. Some prior art silicon pressure sensing die attach solutions attach a sensor die to the housing utilizing a soft adhesive (e.g., RTV, epoxy, etc.). In the case of an absolute pressure sensor, pressure is usually applied from the topside, whereas for gauge or differential pressure sensing, a pressure port is provided on the bottom side of the sensor device. Adhesives, soft or hard, however, are not considered hermetic and, over time, moisture and corrosive gases will penetrate the interface, causing the electronics of the pressure sensor to fail. Additionally, in certain applications the leakage of the media being sensed is undesirable. Also, the thermal coefficient of expansion of the adhesive is different than the thermal coefficient of expansion of silicon; hence, temperature changes can induce stresses in the structure.

Such pressure-sensing die attach solutions do not possess a wide range of media compatibility over the full desirable range of operational temperatures. Similarly, current material restrictions require engineers to specifically match media environment to the materials, thereby limiting the ability of one design to fit multiple environments. Typical solutions may provide media compatibility, but do not possess accuracy and stability over a wide temperature and pressure ranges. In such solutions, the electrical stability of the output signal also varies for a wide range of temperature and pressure due to a diverse coefficient of thermal expansion. Similarly, current post operational conditions require laser trimming to maintain the temperature compensation and linearization accuracy of the device, which can be very costly.

Based on the foregoing, it is believed that a need, therefore, exists for an improved pressure sensor system and method for attaching a sense die to a mounting surface via soldering and includes ASIC compensated output as described in greater detail herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved pressure sensor method and system.

It is another aspect of the present invention to provide for an improved method for attaching a sense die to a mounting surface via soldering for use in a pressure sensor.

It is a further aspect of the present invention to provide for an improved system and method for hermetically attaching the pressure sense die to the mounting surface.

The aforementioned aspects and other objectives and advantages can now be achieved as described herein. An ASIC (Application Specific Integrated Circuit) compensated pressure sensor is disclosed, which includes a sense die and an ASIC. The sense die includes a metallized backside surface for attaching the sense die to a mechanical mounting substrate via soldering. The resulting solder joint provides a hermetic seal that is resistant to a wide range of media associated with different environmental conditions. The mechanical mounting substrate can have many different form factors, which include collars of different styles for ease of assembly. The mounting surface can possess a closely matched coefficient of thermal expansion to the sense die in order to ensure electrical stability of the output signal over a wide temperature and pressure range, or can be a different material in which the ASIC compensation ensures the temperature compensation and linearization accuracy of the device.

The metallized surface of the sense die facilitates soldering to the suitably prepared mounting surface of the substrate. The soldering process can utilize paste, pre-form, or another suitable method. The sense die can be soldered directly to the mounting surface or to a secondary mounting surface that can also facilitate the attachment. The incorporation of the signal conditioning, ASIC provides the required temperature compensation and linearization. The collar can be designed in various shapes in accordance with the design considerations. Such an ASIC compensated pressure sensor is capable of being constructed in several different design options for optimal assembly and environmental protection.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
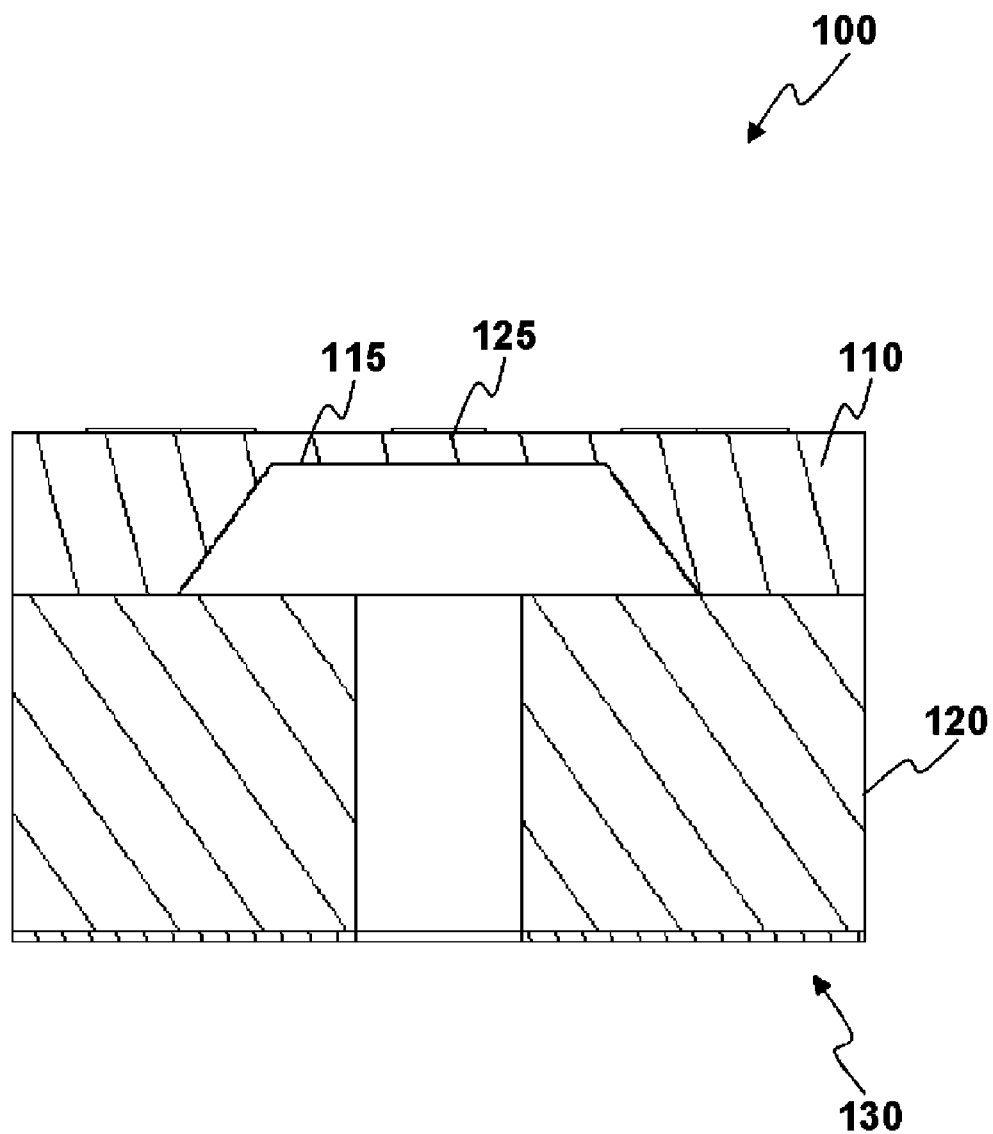
FIG. 1 illustrates a perspective view of a pressure sense die, in accordance with a preferred embodiment.

FIG. 1 illustrates a perspective view of a pressure sense die 100, in accordance with a preferred embodiment. The pressure sense die 100 includes a piezo-resistive element 110 and a constraint pedestal (e.g., glass, silicon, or other) 120. The constraint pedestal 120 provides isolation from stresses induced by the packaging or housing in which the pressure sense die 100 is mounted. The upper surface of the constraint pedestal 120 can be bonded, anodically or by other means, to the piezo-resistive element 110. The pressure sense die 100 normally comprises a pressure diaphragm 115, comprising one or more piezoresistors 125, which may be diffused into die (i.e., or applied by other means) 100 for providing a piezoresistive output signal related to the pressure sensed by the die 100. The piezo-resistive element 110 may be configured from a material such as, for example, silicon, polysilicon or glass, and can be utilized to measure a wide range of pressures. The constraint pedestal 120 possesses a metallized surface 130 that facilitates soldering to a mounting surface 140, which is not shown in FIG. 1, but is depicted in FIG. 2.

Figure 2:
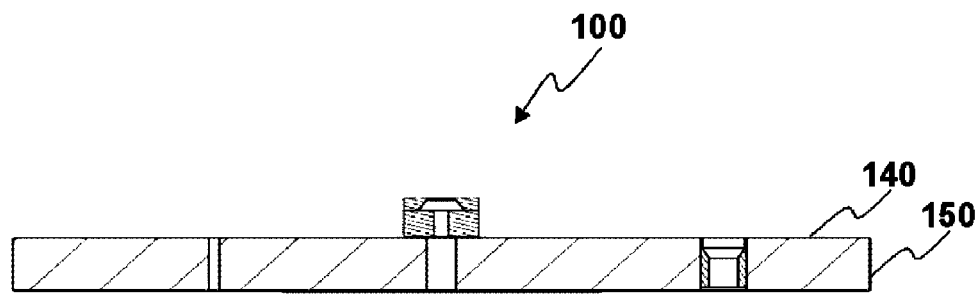
FIG. 2 illustrates a perspective view of a pressure sense die attached to a mounting surface via soldering, in accordance with a preferred embodiment.

FIG. 2 illustrates a perspective view of the pressure sense die 100 attached to the mounting surface 140 via soldering, in accordance with a preferred embodiment. Note that in FIGS. 1-6, identical or similar parts are generally indicated by identical reference numerals. The metallized surface 130 of the pressure sense die 100 can be soldered directly onto the mounting surface 140 associated with a substrate 150. The mounting surface 140 is suitably prepared for soldering and may possess a thermal coefficient of expansion substantially matching the thermal coefficient of expansion of the pressure sense die 100. The substrate 150 may be configured from a material such as, for example, FR4, ceramic, silicon, metal or glass, which provides stress isolation between the pressure sense die 100 and external components utilized for sensing pressure and the surrounding environment. The metallized surface 130, as depicted in FIG. 1, facilitates soldering to the suitably prepared mounting surface 140 of the substrate. The soldering process can utilize, for example, paste, pre-form, or another suitable soldering method.

Figure 3:
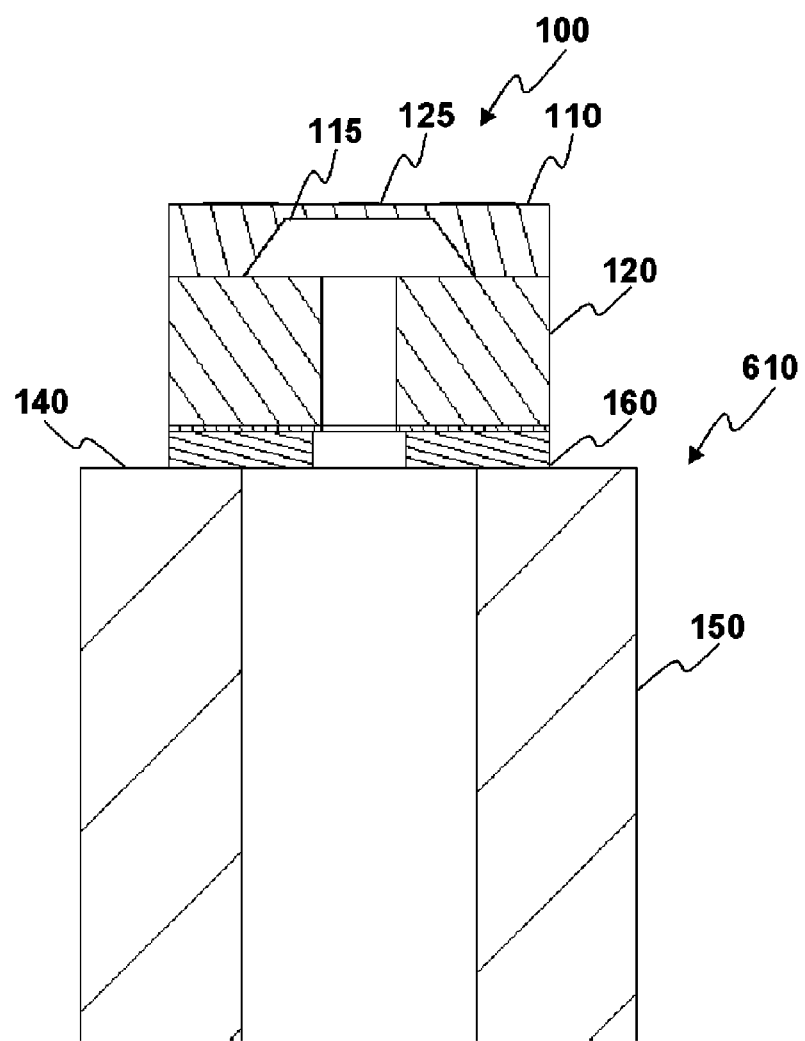
FIG. 3 illustrates an exploded perspective view of the pressure sensor die, in accordance with a preferred embodiment.

FIG. 3 illustrates a perspective view of the pressure sense die 100, in accordance with a preferred embodiment. The solder joint 160 can be utilized to attach the substrate 150 to the pressure sense die 100. The solder joint 160 between the metalized surface 130 and the substrate 150 provides a hermetic seal that is resistant to a wide range of media associated with different environmental conditions. Generally, the solder joint 160 can constitute lead and tin. Other metals that can be utilized in the solder joint 160 include metals such as, for example, aluminum, cadmium, zinc, nickel, gold, silver, palladium, bismuth, copper, antimony, and so forth. It will be apparent to those skilled in the art, however, that other metals can be utilized without departing from the scope of the present invention discussed herein. The solder joint 160 is, thus, very strong over a wide range of temperatures and pressures. Note that the embodiment depicted in FIG. 3 can be considered a sub-assembly 610 that is capable of being incorporated into higher-level assemblies containing amplification and temperature compensation properties.

Figure 4:
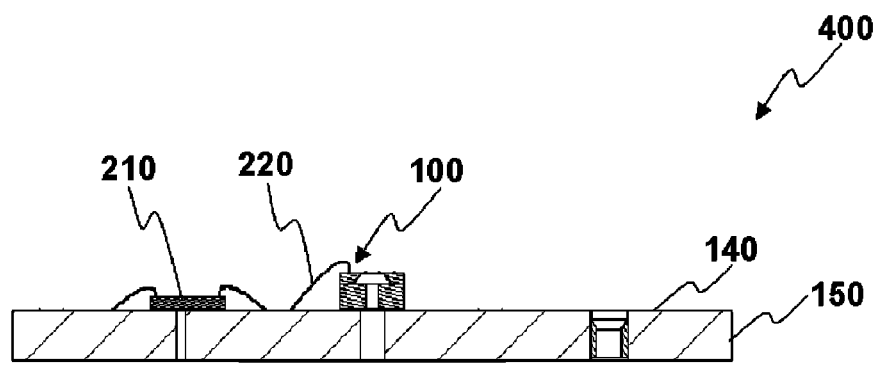
FIG. 4 illustrates a perspective view of a pressure sensor associated with an ASIC, in accordance with a preferred embodiment.

FIG. 4 illustrates a perspective view of a pressure sensor 400 associated with an ASIC 210, in accordance with a preferred embodiment. Note that in another embodiment the pressure sensor 400 may include another means of external amplification and temperature compensation in place of the ASIC 210. The pressure sense die 100 and the ASIC 210 can be electrically connected together internally or externally. The ASIC 210 can be incorporated on the primary substrate 150 utilizing wire bonds 220. The ASIC 210 can be utilized in conjunction with the pressure sensor 400 to receive a sensor input signal and convert the input signal into an output signal utilized by a control system. The incorporation of the signal conditioning ASIC 210 provides the required amplification and temperature compensation necessary for silicon pressure sensors of this general type to measure gage pressure, absolute pressure or differential pressure.

Figure 5:
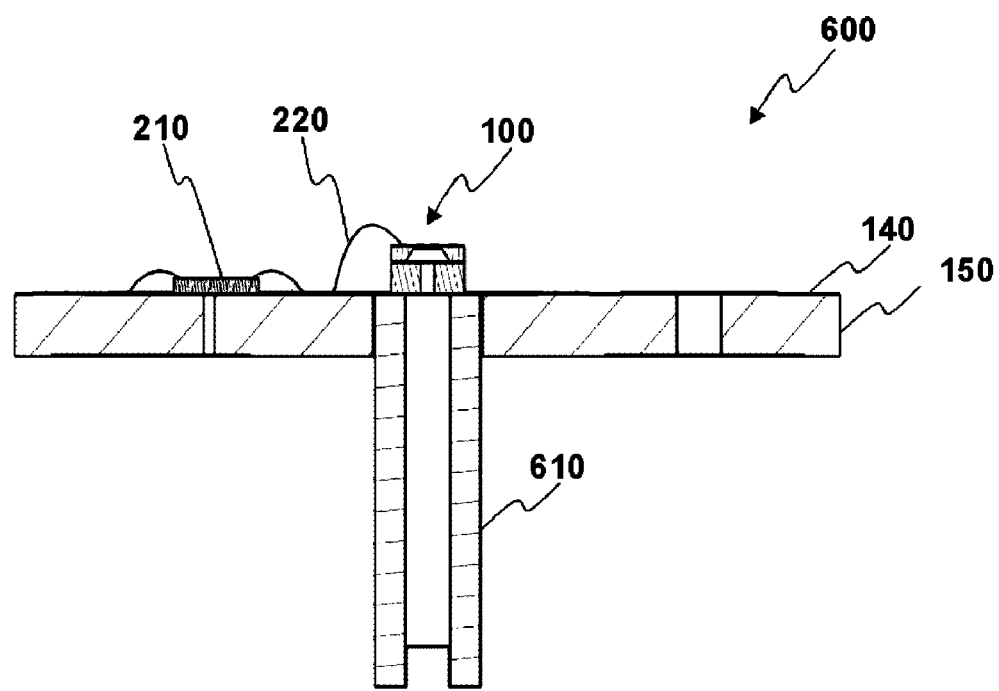
FIG. 5 illustrates a perspective view of a pressure sense die attached to a mounting surface via soldering, which the mounting surface is then attached to an additional mounting surface which contains the ASIC and electronics, in accordance with a preferred embodiment.

FIG. 5 illustrates a perspective view of a pressure sensor 600 associated with a sub-assembly 610, in accordance with a preferred embodiment. The sub-assembly 610 can be attached to the primary substrate 150. The primary substrate 150 mechanically supports and electrically connects the components of the pressure sensor 600. The mounting surface 140 of the substrate 150 includes the ASIC 210 and the wire bonds 220. The mounting surface 140 can contain the ASIC 210 and electronics for compensation or can be attached to another sub-assembly 610, which contains the ASIC and electronics.

Figure 6:
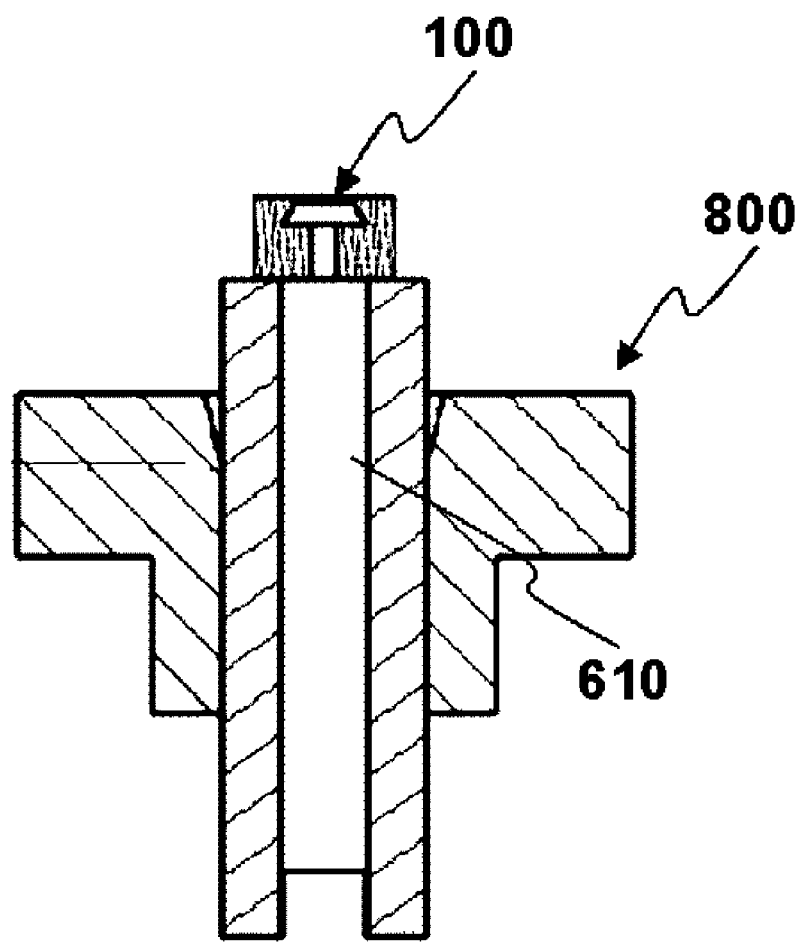
FIG. 6 illustrates a perspective view of a collar, which can be implemented in accordance with an alternative embodiment.

FIG. 6 illustrates a perspective view of a collar 800 associated with the sub-assembly 610, which can be utilized in accordance with an alternative embodiment. The ASIC compensated pressure sensor as depicted in FIG. 6 incorporates the pressure sense die 100, the ASIC 210, and support elements, such as, for example, collar 800, and sub-assembly 610, which an be bonded to the substrate 150. The resulting solder joint 160 between pressure sense die 100 and mounting surface 140 can provide for a hermetic seal that is resistant to a wide range of media in different environmental conditions. The mounting surface 140 may also be configured to possess a closely matched coefficient of thermal expansion with respect to the pressure sense die 100 in order to ensure the electrical stability of the output signal over a wide range of temperatures and pressures. The incorporation of the signal-conditioning ASIC 210 additionally provides the required accuracy to avoid the need for post die attachment laser trim operations. Such an ASIC compensated pressure sensor is capable of being constructed in several different design options for optimal assembly and environmental protection.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:
1. A pressure sensor apparatus, comprising;
a mounting substrate having a plurality of wire bond pads;
a pressure sense device having a pressure sense element, the pressure sense element including a diaphragm and one or more sensing components positioned on the diaphragm, the pressure sense device having one or more pads;
a pedestal having a first surface bonded to the pressure sense device and a second opposite surface, the pedestal configured to reduce package induced stresses in the pressure sense device, the pedestal including an aperture in fluid communication with the diaphragm of the pressure sense device extending between the first and second surfaces of the pedestal;

a solder material attaching the second surface of the pedestal to the mounting substrate, the solder material forming a hermetic seal between the second surface of the pedestal and the mounting substrate;

a signal conditioning device electrically connected to said pressure sense device for conditioning a signal received from the pressure sense device corresponding to a pressure sensed by the pressure sense element, the signal conditioning device having one or more pads;

one of more first wire bonds electrically connecting one or more pads of the pressure sense device to one or more of the plurality of wire bond pads of the mounting substrate; and one or more second wire bonds electrically connecting one or more pads of the signal conditioning device to one or more of the plurality of wire bond pads of the mounting substrate.

2. The apparatus of claim 1, wherein said mounting substrate and said pressure sense device have closely matched coefficients of thermal expansion.

3. The apparatus of claim 1 wherein the mounting substrate is attached to at least one collar for mechanical mounting.

4. The apparatus of claim 1 wherein said mounting substrate is attached to one or more of pressure connectors.

5. The apparatus of claim 1, wherein the signal conditioning device is attached to the mounting substrate.

6. The apparatus of claim 1, wherein the mounting substrate includes a first mounting substrate and a second mounting substrate, with the first mounting substrate secured relative to the second mounting substrate, and wherein the pressure sense device is secured to the first mounting substrate and the signal conditioning device is secured to the second mounting substrate.

7. The apparatus of claim 1, wherein the mounting substrate includes an aperture that is in fluid communication with the aperture of the pedestal.

8. A pressure sensor apparatus, comprising:
a mounting substrate;
a pressure sense device having a topside surface including one or more pressure sensing elements and an at least partially metallized backside surface attached to the mounting substrate, wherein said mounting substrate is attached to said metallized backside surface of said pressure sense device with a soldering material; and
a signal conditioning device electrically connected to said pressure sense die for conditioning a signal received from the pressure sense die corresponding to a sensed pressure, the signal conditioning device attached to the mounting substrate adjacent to the pressure sense device.

9. The apparatus of claim 8, further comprising a plurality of electrical connections including one or more wire bonds for electrically connecting said pressure sense die to said signal conditioning device.

10. The apparatus of claim 8 wherein said mounting substrate is attached to one or more collars for mechanical mounting.

11. The apparatus of claim 8 wherein said mounting substrate is attached to one or more pressure connectors.

12. The apparatus of claim 8, wherein the signal conditioning device is attached directly to the mounting substrate.

13. The apparatus of claim 8, wherein the mounting substrate includes a first mounting substrate and a second mounting substrate, with the first mounting substrate secured relative to the second mounting substrate, and wherein the pressure sense device is secured to the first mounting substrate and the signal conditioning device is secured to the second mounting substrate.

14. A method of forming a pressure sensor apparatus, comprising:
providing a pressure sense die having a pressure sense element that includes a diaphragm and one or more pressure sensing components positioned on the diaphragm;
bonding a front side of a pedestal to the pressure sense die, the pedestal including an aperture in fluid communication with the diaphragm of the pressure sense die;
providing a metallized backside surface to a back side of the pedestal;
soldering a mounting substrate to said metallized surface;
bonding a signal conditioning device to the mounting substrate adjacent to the pressure sense die;
wire bonding one or more pads of the pressure sense die to one or more pads of the mounting substrate; and
wire bonding one or more pads of the signal conditioning device to one or more pads of the mounting substrate, such that the signal conditioning circuitry receives and conditions a signal from said pressure sense die.

15. The method of claim 14 further comprising selecting said mounting substrate to include a coefficient of thermal expansion that is similar to a coefficient of thermal expansion of said pressure sense die and/or pedestal.

16. The apparatus of claim 14 wherein said mounting substrate is attached to one or more collars for mechanical mounting.

17. The method of claim 14, wherein the mounting substrate includes a first mounting substrate and a second mounting substrate, with the first mounting substrate secured relative to the second mounting substrate, the method further comprising:
soldering the first mounting substrate to said metallized surface; and
bonding the signal conditioning device to the second mounting substrate.

* * * * *